United States Patent [19]

Kitazima et al.

[11] Patent Number: 4,649,517
[45] Date of Patent: Mar. 10, 1987

[54] INFORMATION HOLDING DEVICE

[75] Inventors: Masaaki Kitazima, Hitachiohta; Hideaki Kawakami, Mito; Yoshiharu Nagae, Hitachi, all of Japan

[73] Assignee: Hitachi, Ltd., Tokyo, Japan

[21] Appl. No.: 583,356

[22] Filed: Feb. 24, 1984

[30] Foreign Application Priority Data

Feb. 25, 1983 [JP] Japan ................................. 58-29450

[51] Int. Cl.⁴ ............................................. G11C 13/04
[52] U.S. Cl. ..................... 365/108; 350/333; 350/351
[58] Field of Search ................ 365/106, 108, 149; 340/784; 350/350 S, 331 R, 333, 351, 330, 334

[56] References Cited

U.S. PATENT DOCUMENTS

| 3,118,133 | 1/1964 | Meeker et al. | 365/149 |
| 3,796,999 | 3/1974 | Kahn | 365/108 |
| 3,967,253 | 6/1976 | Tsuruishi | 365/108 |
| 4,040,047 | 8/1977 | Hareng et al. | 365/108 |
| 4,221,471 | 9/1980 | Gurtler | 350/331 R |
| 4,396,997 | 8/1983 | Kahn et al. | 365/108 |

Primary Examiner—Joseph A. Popek
Attorney, Agent, or Firm—Antonelli, Terry & Wands

[57] ABSTRACT

An information holding device comprises a pair of substrates having a first electrode and a second electrode oppositely formed on opposing surfaces thereof, and a dielectric material held between the pair of substrates. A capacitance of the dielectric material between the first and second electrodes is changed and a voltage varying with time is applied to the dielectric. A displacement current flowing through the dielectric is then detected.

20 Claims, 22 Drawing Figures

INFORMATION HOLDING DEVICE

BACKGROUND OF THE INVENTION

The present invention relates to an information holding device, and more particularly to such a device capable of outputting stored information to an external device.

In the past, a device made of a liquid crystal having a smectic phase with a display function and an information holding function and a device made of a dielectric material such as PLZT have been known as the information holding devices. Hereinbelow, a liquid crystal device having the display function and the information holding function will be explained as an example of the information holding device.

The liquid crystal devices of various display principles including a liquid crystal having a nematic phase, a liquid crystal having a cholesteric phase or a liquid crystal having a smectic phase have been known. In those devices, orientations of liquid crystal, molecules are changed by an external field and the resulting change of an optical property is used to display the information.

As an example of such liquid crystal devices, a thermal writing type liquid crystal device disclosed in U.S. Pat. No. 3,796,999 "Locally Erasable Thermo-Optic Smectic Liquid Crystal Storage Displays" will be explained below.

In the disclosed device, transparent electrodes 13 and 14 are arranged on the inner surfaces of a pair of glass substrates 11 and 12 as shown in FIG. 1a, and the space between them is filled with a liquid crystal 15 having a smectic phase. A laser beam 16 emitted from an argon (Ar) laser or a yttrium-aluminum-garnet (YAG) laser is focused on the display panel through a lens 17 to heat the smectic liquid crystal 15 of an area 18 to be displayed, thereby rendering it an isotropic liquid crystal phase.

Then, the laser beam is removed to quickly cool the liquid crystal to the smectic phase. As a result, orientations of the liquid crystal molecules are disturbed and a region 19 which exhibits a strong scattering property is produced as shown in FIG. 1b. Since this scattered state persists stably, a desired image information can be stored.

Based on the display principle described above, the thermal writing type display device can write a desired image information on the liquid crystal elements by the scan and the modulation of the laser beam, and local erasure is attained by the application of an electric field. Thus, it is preferable as a display device, but it does not have a function to read out the stored image information or a function to output the information to an external device such as a computer and it is merely used as an input device of an image information signal.

The other known liquid crystal devices (e.g., U.S. Pat. No. 4,196,974) also have only the function of displaying the image and they are not used as the information output devices.

SUMMARY OF THE INVENTION

A first object of the present invention is to eliminate the disadvantages described above, and to provide an information holding device capable of inputting/outputting an information signal in such a way that an information holding device made of a dielectric such as a liquid crystal having a smectic phase is endowed with the function of reading out information in a short time.

A second object of the present invention is to provide, in an information holding device wherein picture elements are arranged in the form of an X-Y matrix, an information holding device capable of inputting/outputting an information signal with a simple circuit without any influence of current due to crosstalk.

A first feature of the present invention for accomplishing the first object consists in comprising a pair of substrates whose opposing surfaces are formed with one electrode and the other electrode so that they may oppose, a dielectric which is held between said pair of substrates, means to change a capacitance of the dielectric in the opposing part between said one electrode and said other electrode, means to apply a voltage varying with time to the dielectric of said opposing part, and means to detect principally a displacement current flowing through the dielectric of said opposing part.

Further, a second feature of the present invention for accomplishing the second object consists in comprising a pair of substrates whose opposing surfaces are formed with a plurality of electrodes on one side and a plurality of electrodes on the other side so that they may oppose and that opposing parts between the electrodes on the one side and those on the other side may form a matrix as a whole, a dielectric which is held between said pair of substrates, means to change a capacitance of the dielectric in any desired one of the opposing parts, means to selectively apply a voltage varying with time to any desired one of said electrodes on said one side, and means to detect principally a displacement current flowing to the electrode on said other side.

Here, the "dielectric" indicates a dielectric whose capacitance is changed by applying an electric field, heat or the like and is stored without any change for a fixed time even after the electric field, the heat or the like has been removed. For example, a liquid crystal having a smectic A phase, a liquid crystal having a cholesteric phase, PLZT, etc. are mentioned. It is preferable to use the liquid crystal having the smectic A phase which can write information at a comparatively low temperature and whose storage time is long.

As the "voltage varying with time", there is mentioned a ramp voltage, a triangular wave voltage, a sinusoidal wave voltage or the like. As will be described later, the ramp voltage and the triangular wave voltage which have constant dV/dt are preferable in point of the detection accuracy. Desirably, the voltage has such an extent of value that the capacitance of the dielectric is scarcely changed.

Other objects and features of the present invention will become apparent from the following description of embodiments.

DESCRIPTION OF THE PREFERRED EMBODIMENTS

Hereinbelow, the present invention will be described in detail by taking as an example a liquid crystal having a smectic A phase.

EMBODIMENT 1

Figure 1A:
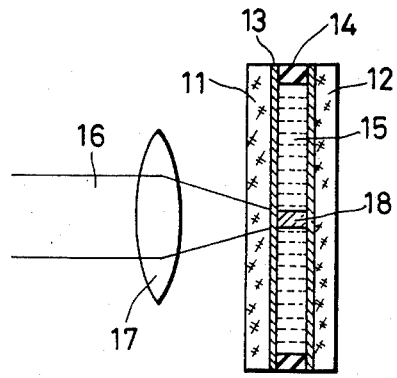
FIGS. 1a and 1b are views showing a liquid crystal display device in a prior art.
Figure 1B:
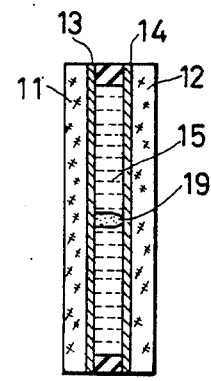
Figure 2:
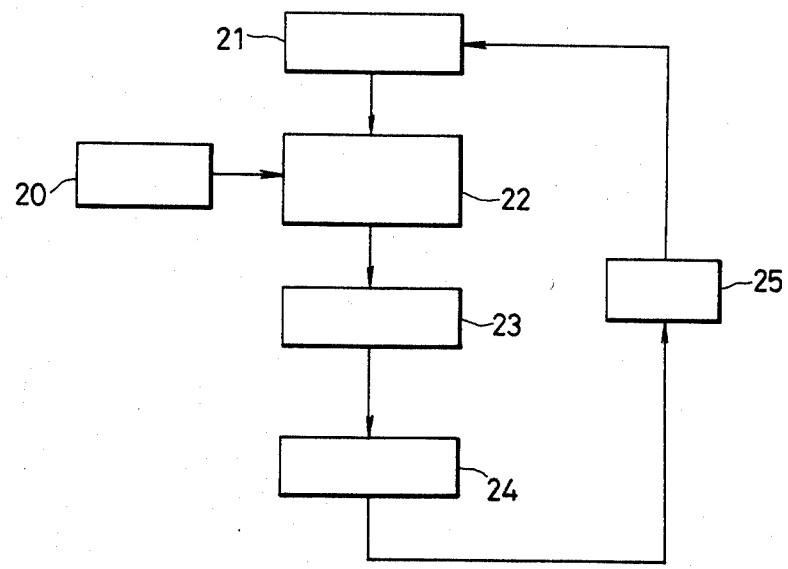
FIG. 2 is a block diagram of the whole device of an embodiment of the present invention.

FIG. 2 shows a diagram of the general arrangement of a liquid crystal device according to an embodiment of the present invention.

Picture information writing means 21 is means for changing the capacitance of a liquid crystal having a smectic A phase as serves as the dielectric of the opposing part between one electrode and the other electrode of substrates, thereby to write picture information such as characters and symbols into a liquid crystal panel 22. The picture information written in the liquid crystal panel 22 is read out by a picture information reading voltage generator circuit 20 which generates a voltage varying with time to be applied to the liquid crystal in the opposing part of the electrodes, and a picture information detector circuit 23 which detects principally a displacement current flowing through the dielectric of the opposing part of the electrodes. The picture information read out is sent to a picture signal converter circuit 24. A picture information signal produced here is fed into an external circuit 25 which is composed of, for example, a microprocessor (CPU).

Figure 3:
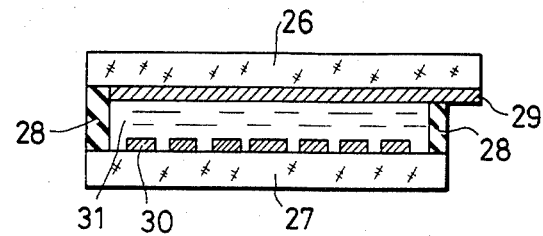
FIGS. 3 and 4 are structural views of a liquid crystal panel for use in the embodiment of the present invention.
Figure 4:
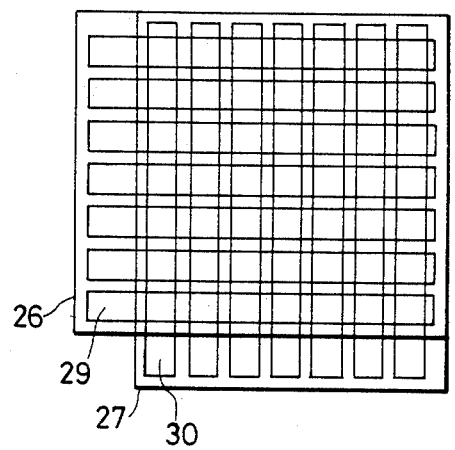

Next, the arrangements and operations of the respective portions will be described. A schematic sectional view of the liquid crystal panel 22 is shown in FIG. 3, while a schematic plan view is shown in FIG. 4. In the liquid crystal panel, a gap of about 10 μm is defined between a pair of substrates 26 and 27 which have a plurality of Y-electrodes 29 and a plurality of X-electrodes 30 juxtaposed on their opposing surfaces in a manner to intersect each other, and a liquid crystal 31 having a smectic A phase is contained between the substrates and is sealed by a spacer 28. Here, the opposing parts between the Y-electrodes 29 and the X-electrodes 30 become picture elements and form a matrix as a whole.

Although, in the present embodiment, each of the substrates is provided with the plurality of electrodes, it may well be provided with a single electrode.

The substrates 26 and 27 may be glass plates or plastic plates, or the non-viewing substrate may be an opaque substrate such as a Si-substrate and the viewing substrate may be a transparent substrate such as a glass plate or a plastic plate.

The electrodes 29 and 30 may be transparent conductive films such as mixture of indium oxide and tin oxide, or the electrode on the viewing substrate may be the transparent conductive film and the other electrode may be a metal such as Al or Cr.

The liquid crystal material may be mixture including

(where R is an alkali radical) which exhibit a positive dielectric anisotropy and the smectic A phase at room temperatures and changes from the smectic phase to a nematic phase at 42° C. and from the nematic phase to an isotropic liquid phase at 45° C.

Other liquid crystals having the smectic A phase are mixture of 4, 4' alchoxy biphnyl carboxylic acid alkyl ester and 4, 4' alkyl cyanotran and mixture of 4-alchoxy phenyl-4'-alkyl benzoic acid ester and p,p'-alkyl cyano biphenyl. When dichronic dye is added to the liquid crystal, a viewing angle property of display is improved and it is desirable to the display device.

Figure 5:
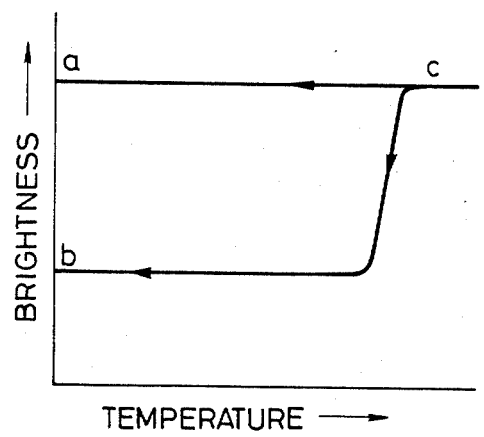
FIG. 5 is a temperature characteristic diagram of a liquid crystal for use in the embodiment of the present invention.

FIG. 5 shows an optical characteristic of the liquid crystal having the smectic phase. When the liquid crystal having the smectic phase is heated, it exhibits an isotropic liquid phase (point c) and an essentially transparent state. When the liquid crystal layer is cooled while a sufficient voltage is applied thereto, it exhibits a smectic phase (point a) and an essentially transparent state, and this state is retained (non-write state).

On the other hand, when the voltage applied to the liquid crystal layer is set to or around zero volt, it exhibits a smectic phase having a scattering property (point b) and a brightness is reduced. This state is retained thereafter (write state).

The present inventors have found that when the voltage applied to the liquid crystal layer is changed in the course of cooling of the liquid crystal layer, the amount of scatter changes so that a tonality is imparted to the display. The inventors have also found that a static capacitance of the liquid crystal having the smectic phase does not substantially change for several days to several months after the electric field or the heat has been removed.

Interfaces between the electrodes 29 and 30 and the liquid crystal having the smectic phase are treated with silane surface active agent so that they are homeotropically oriented, that is, the liquid crystal molecules having the smectic phase are oriented in a direction perpendicularly to the substrates, although they may be oriented in a direction parallel to the substrates.

The liquid crystal material is not limited to the liquid crystal having the smectic phase but it may be other liquid crystal such as a liquid crystal having a cholesteric phase whose orientation is changed by the application of an external field and retained for a predetermined time period after the external field has been removed.

EMBODIMENT 2

Figure 6:
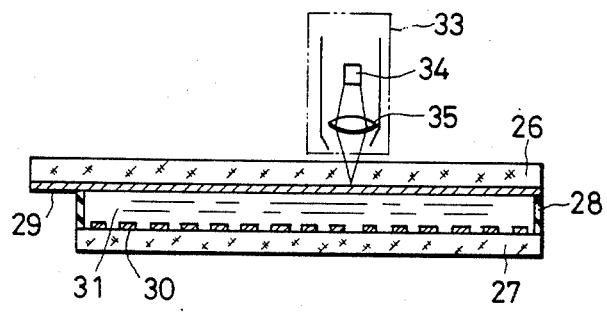
FIGS. 6 to 9 are diagrams showing embodiments of picture information writing.

Next, the picture information writing means 21 will be described. FIG. 6 shows means for writing picture information by projecting a laser beam on the liquid crystal panel which employs the liquid crystal having the smectic phase.

The means of FIG. 6 is provided with a laser pen 33 which can condense the laser beam on any desired position. The laser pen 33 to be used is, for example, one which is constructed of an optical fiber for guiding the laser beam from a light source and a condensing lens, or one in which a semiconductor laser 34 and a condensing lens 35 are made unitary. The inventors have experimentally confirmed that the writing of picture information can be achieved by condensing laser power which is at least 10 mW on the surface of the liquid crystal element.

EMBODIMENT 3

Figure 7:
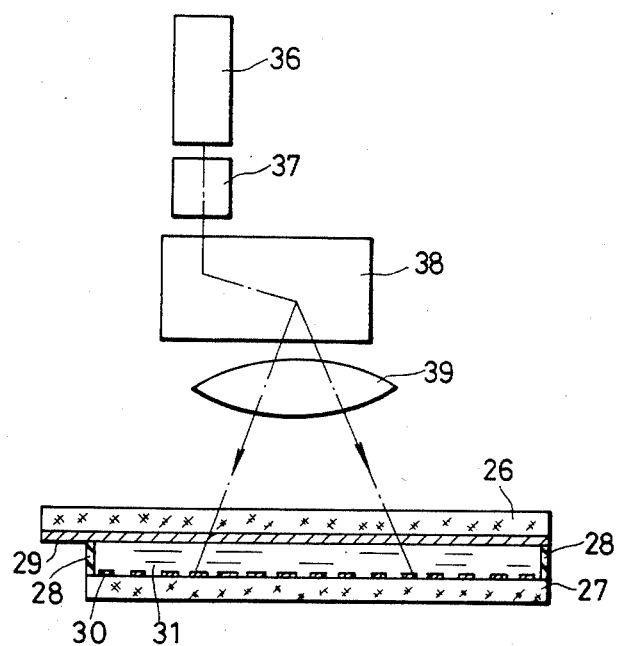

FIG. 7 shows another picture information writing means. It is constructed of a laser 36, a modulator 37 which modulates the laser beam, a deflector 38 for the X-direction and the Y-direction which deflects the laser beam in any desired direction, and a lens 39 which condenses the laser beam on the surface of the liquid crystal element.

The laser 36 which the inventors use is, for example, a YAG laser whose power is 1 W in the single mode and whose beam spread angle is within 1 mrad.

An acoustooptic modulator is employed as the modulator 37. By way of example, a plane mirror (galvanometer) whose angle can be controlled by the quantity of current is used as the deflector 38.

In either system, the laser beam is absorbed by the electrodes 29 or the electrodes 30, and the electrodes are heated. As a result, the liquid crystal having the smectic phase is also heated to change into the isotropic liquid phase. When the laser beam is subsequently removed, the liquid crystal is rapidly cooled to change into the smectic phase again. At this time, the orientation direction of the liquid crystal molecules is disordered, and the liquid crystal scatters external light and falls into a written state because this scattered state continues to exist stably. Further, the part of the liquid crystal not irradiated with the laser beam exhibits the initial state (non-write state) and is in the transparent state.

In bringing the whole area of the liquid crystal panel into the initial state, the purpose can be attained in such a way that a D.C. voltage or A.C. voltage is applied across the Y-electrodes 29 and X-electrodes 30 after the whole area of the liquid crystal panel has been heated or that a comparatively great D.C. voltage or A.C. voltage is applied without heating.

EMBODIMENT 4

Figure 8:
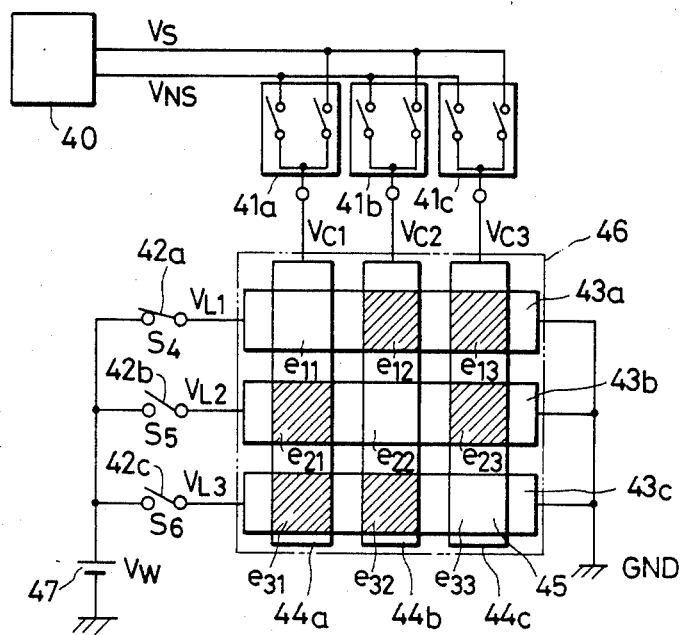

Next, another embodiment of the picture information writing means for the liquid crystal panel which employs the liquid crystal having the smectic phase is illustrated in FIG. 8.

The structure of the liquid crystal panel 46 is the same as that of the liquid crystal panel shown in FIG. 4. Switches 42a–42c are connected to the terminals on one side, of Y-electrodes 43a–43c formed on one substrate, while the terminals thereof on the other side are connected to GND (0 V).

Further, switch pairs 41a–41c are connected to X-electrodes 44a–44c formed on the other substrate.

A heating power source 47 is connected to the switches 42a–42c, while a driver circuit 40 is connected to the switch pairs 41a–41c. The driver circuit 40 produces a selecting voltage $V_S$ and a nonselecting voltage $V_{NS}$, and $V_S < V_{NS}$ (in effective values) is held.

Figure 9:
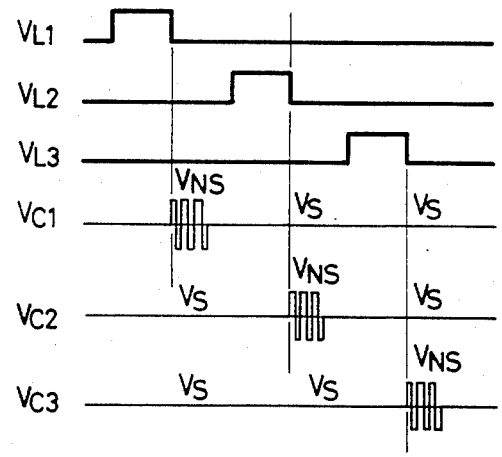

$V_S$ is a voltage to the extent of allowing the liquid crystal to change from (the point c) to (the point b) in the characteristic shown in FIG. 5, and it is set at or near 0 V in the present embodiment. Besides, $V_{NS}$ is a voltage to the extent of allowing the liquid crystal to change from (the point c) to (the point a) in the characteristic shown in FIG. 5. Not only pulse waves as shown in FIG. 9, but also sinusoidal waves, intermittent pulses etc. are selected. However, A.C. voltages whose average values become 0 V are desirable for preventing the deterioration of the liquid crystal.

Here, in a case where, among the picture elements of the liquid crystal panel 46, hatched ones $e_{12}$, $e_{13}$, $e_{21}$, $e_{23}$, $e_{31}$ and $e_{32}$ are assumed to be in the write state (scattering stage) and the others $e_{11}$, $e_{22}$ and $e_{33}$ in the non-write state (transparent state), voltages shown in FIG. 9 are applied to the X-electrodes 44a–44c and the Y-electrodes 43a–43c.

In the state in which all the switch pairs 41a–41c are turned "off", the switch 42a is turned "on" for a fixed time so as to apply a heating voltage $V_W$ to the Y-electrode 43a. As a result, the Y-electrode 43a generates heat, and the liquid crystal is heated by the Joule heat to change from the smectic phase into the isotropic liquid phase.

Subsequently, when the switch 42a is turned "off" to remove the heating voltage $V_W$, the liquid crystal cools rapidly. At this time, only one switch of the switch pair 41a is turned "on" so as to choose and deliver the nonselecting voltage $V_{NS}$. The remaining switch pairs 41b and 41c choose and deliver the selecting voltage $V_S$ ($\approx 0$). As a result, the hatched picture elements $e_{12}$ and $e_{13}$ fall into the write state, and the picture element $e_{11}$ falls into the non-write state.

The operations stated above are similarly performed as to the Y-electrodes 43b and 43c in succession.

EMBODIMENT 5

Next, the principle of a method of reading out picture information will be described.

As stated before, the liquid crystal having the smectic phase for use in the present embodiment exhibits the positive dielectric anisotropy. That is, the relationship between dielectric constant $\epsilon\|$ in the major axis direction of the liquid crystal molecules and dielectric constant $\epsilon\bot$ in the minor axis direction is $\epsilon\| > \epsilon\bot$.

In the non-write state thus far described, accordingly, the liquid crystal molecules are oriented perpendicularly to the electrodes, and dielectric constant of the liquid crystal layer is approximately equal to dielectric constant $\epsilon\|$ in the major axis direction of the liquid crystal molecules.

Besides, in the write state, the orientation direction of the liquid crystal molecules is conspicuously disordered. Assuming that the orientation direction be completely random, the specific inductivity of the liquid crystal layer becomes close to the three-dimensional average value $\frac{1}{3}(\epsilon\| + 2\epsilon\bot)$ of dielectric constant in the major axis $\epsilon\|$ and the specific inductivity in the minor axis direction $\epsilon\bot$ of the liquid crystal molecules, and it is a value smaller than $\epsilon\|$.

Figure 10:
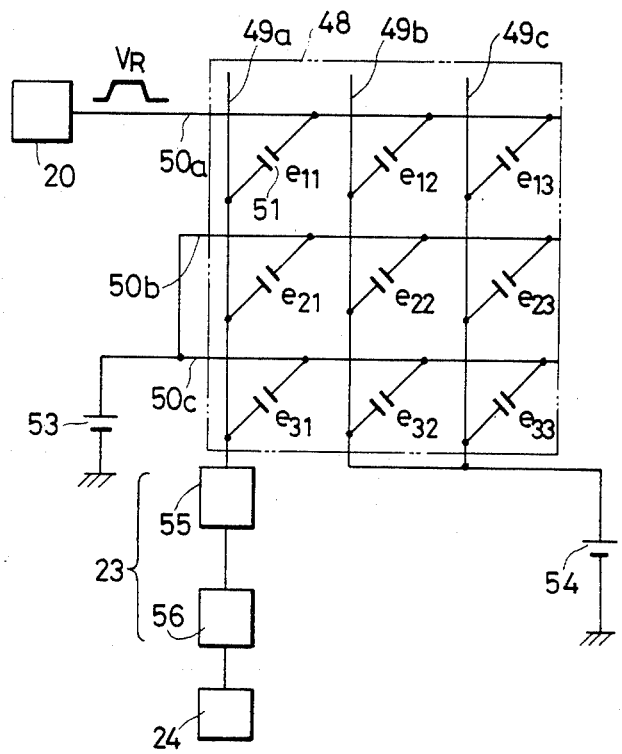
FIGS. 10, 11(a)-11(c) and 12 to 18 are diagrams showing embodiments of picture information reading operations.

Here, when the picture elements $e_{11}$–$e_{33}$ arranged in the shape of the matrix as shown in FIG. 8 are considered as a kind of capacitors, the liquid crystal panel 46 can be deemed a group of capacitors 48 as shown in FIG. 10.

Since, at this time, the respective picture elements are filled with the liquid crystal layer being the dielectric between the electrodes, their capacitances differ owing to the unequal dielectric constants caused by the different molecular orientations between the write state and in the nonwrite state as described before.

Accordingly, the capacitance $C_W$ of the picture element in the write state and that $C_{NW}$ of the picture element in the non-write state differ. In the case of the foregoing example where the liquid crystal material having the positive dielectric anisotropy is employed and is perpendicularly oriented in the non-write state, $C_W < C_{NW}$ holds, and the ratio becomes:

$$\frac{C_{NW}}{C_W} = \frac{\epsilon\|}{\frac{1}{3}(\epsilon\| + 2\epsilon\perp)} > 1 \qquad (1)$$

The inventors measured the capacitances by the use of a liquid crystal material of $\epsilon\| = 12$ and $\epsilon\perp = 4.7$. As a result, it has been confirmed that $C_{NW}/C_W = 1.48$ holds, which is a value close to a value 1.68 calculated in accordance with Equation (1).

Besides, in a case where the liquid crystal material having the positive dielectric anisotropy is used and where the initial orientation is rendered the horizontal orientation, $C_W > C_{NW}$ holds.

As stated above, the picture element in the write state and that in the non-write state have unequal capacitances. By electrically reading out the difference of the capacitances, therefore, the written information can be recognized and outputted to an external device.

There will now be explained embodiments of the picture information reading voltage generator circuit 20, the picture information detector circuit 23 and the picture information signal converter circuit 24 which are shown in FIG. 2.

FIG. 10 shows an example of the fundamental setup of the picture information reading method. The liquid crystal circuit 48 is such that the liquid crystal panel shown in FIG. 8 is expressed by the equivalent circuit of the capacitors. Electrodes consist of X-electrodes 49a–49c and Y-electrodes 50a–50c.

Here, it is assumed that the picture information of one $e_{11}$ of the picture elements 51 be read out. To this end, the Y-electrode 50a is supplied with a reading voltage $V_R$ from the picture information reading voltage-generator circuit 20. The other Y-electrodes 50b and 50c are connected to a constant voltage source 53.

On the other hand, a current - voltage converter circuit 55 is connected to the X-electrode 49a. Further, the output of this circuit is applied to a waveshaping circuit 56. The output shaped here is applied to the picture information signal converter circuit 24. The other X-electrodes 49b and 49c are connected to a constant voltage source 54.

Here, the reading voltage $V_R$ may be one with which the voltage across the picture element $e_{11}$ varies with time, and it need not be especially restricted.

That is, the feature of the present invention consists particularly in reading out information by regarding the picture element $e_{11}$ as the capacitance and deciding the magnitude of a displacement current principally.

Figure 11A:
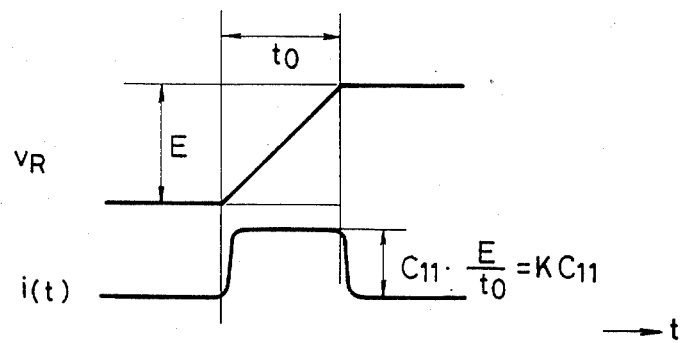
Figure 11B:
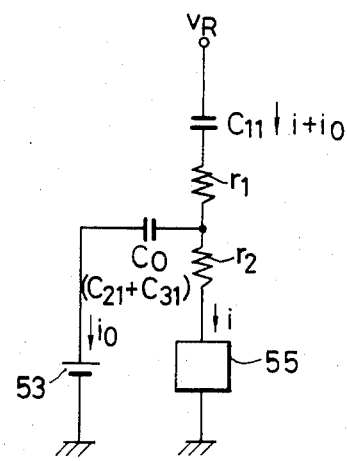
Figure 11C:
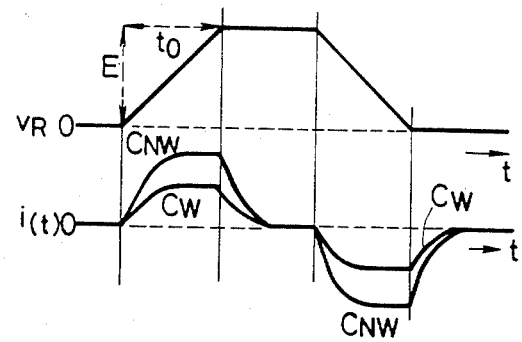

FIGS. 11a to 11c show the situation at the time at which the capacitance of the picture element $e_{11}$ is read out. Here, the capacitances of the picture elements $e_{11}$, $e_{21}$ and $e_{31}$ are denoted by $C_{11}$, $C_{21}$ and $C_{31}$ respectively.

It is assumed by way of example that the reading voltage $V_R$ be a ramp voltage of $dV/dt = E/t_o = K$ as shown in FIG. 11a, and that a wiring resistance $r_1$ and a wiring resistance $r_2$ be sufficiently small. Then, the displacement current $i$ flowing to the current-to-voltage converter circuit 55 is saturated to a value of $K \cdot C_{11}$ in a short time.

Now, assuming $C_0 = C_{21} + C_{31}$ in FIG. 11b, the following holds:

$$\begin{cases} \frac{1}{C_{11}} \int (i + i_o)dt + r_1(i + i_o) + r_2 i = Kt & (2) \\ \frac{i}{r_2} = \frac{1}{C_o} \int i_o dt & (3) \end{cases}$$

The displacement current $i(t)$ is evaluated by the Laplace transform etc. from Equations (2) and (3), as follows:

$$i(t) = K \cdot C_{11} \left( \frac{\beta e^{\alpha t} - \alpha e^{\beta t}}{\beta - \alpha} \right) \qquad (4)$$

Here, putting $$A = r_1 r_2 C_0, \quad B = r_1 + r_2 + \frac{r_2 C_0}{C_{11}}$$

then the following holds:

$$\alpha = \frac{-\frac{B}{A} + \sqrt{\left(\frac{B}{A}\right)^2 - \left(\frac{4}{C_{11}A}\right)}}{2} < 0 \qquad (5)$$

$$\beta = \frac{-\frac{B}{A} - \sqrt{\left(\frac{B}{A}\right)^2 - \left(\frac{4}{C_{11}A}\right)}}{2} < 0 \qquad (6)$$

From Equation (4), $i(t=0)=0$ and $i(t=\infty)=K \cdot C_{11}$. It is understood that the displacement current $i$ at the saturation becomes $K \cdot C_{11}$, does not depend upon the other capacitance $C_0(=C_{21}+C_{31})$ or the wiring resistances $r_1$ and $r_2$ of the electrode and is not affected by a current due to crosstalk.

As shown in FIG. 11c accordingly, the detection of the displacement current $i$ makes it possible to detect the capacitance $C_W$ of the picture element in the write state and the capacitance $C_{NW}$ of the picture element in the non-write state, and the picture information can be read out in a short time.

Although the picture information may well be read out by detecting the displacement current $i$ in the transition state, it enhances the detection accuracy more to detect the displacement current $i$ after being saturated and stabilized as shown in 11c.

Further, the detection of the displacement current $i$ may be performed during either the rise or the fall of the reading voltage $V_R$.

Even when the "reading voltage $V_R$ varying with time" is, for example, a sinusoidal wave voltage other than the voltage whose $dV/dt$ is constant $(=K)$, the capacitance can be detected. As understood from Equation (4), however, the detection is easier when $dV/dt$ is constant $(=K)$. As such voltages of constant $dV/dt$, a triangular wave voltage etc. are mentioned besides the ramp voltage as illustrated in FIG. 11c.

The orientation state of the liquid crystal molecules changes when a voltage not lower than a specified threshold value has been applied. Therefore, the reading voltage $V_R$ which is applied for detecting the capacitance should preferably be set at a voltage value less than the threshold value of the liquid crystal.

Figure 12:
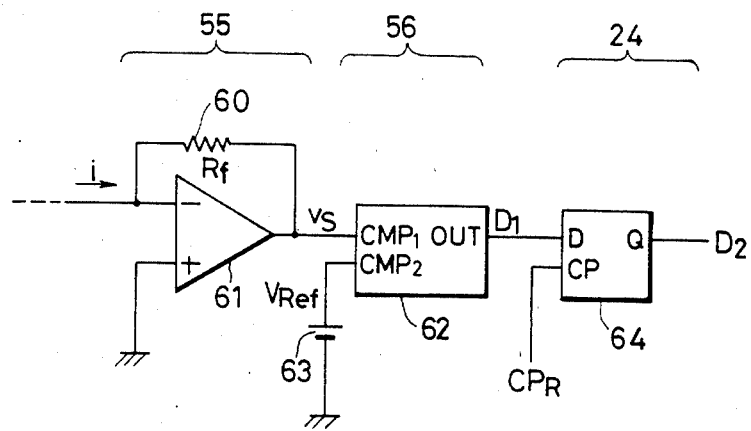
Figure 13:
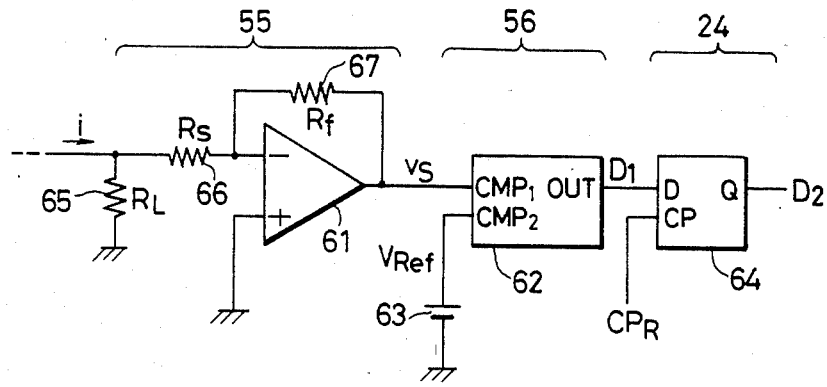

FIGS. 12 and 13 show practicable examples of the current - voltage converter circuit 55, waveshaping circuit 56 and picture information signal converter circuit 24.

First, in the current - voltage converter circuit 55 of FIG. 12, a detected displacement current i is converted into a voltage by the use of an operational amplifier 61 and a resistor 60. At this time, the output voltage $v_s$ of the operational amplifier 61 becomes $v_s = -i \cdot R_f$.

The waveshaping circuit 56 comprises a comparator 62, one input terminal of which is supplied with the output voltage $v_s$ of the current - voltage converter circuit 55 and the other input terminal of which is supplied with a reference voltage $V_{Ref}$ produced by a reference voltage source 63. Thus, the magnitude of the capacitance of a picture element. By varying $V_{Ref}$ at will, a half tone in the picture information display can also be judged.

Further, if necessary, the picture information signal converter circuit 24 temporarily holds an output voltage produced by the waveshaping circuit 56, with a latch timing signal $CP_R$ by the use of a data latch circuit 64.

In FIG. 13, another embodiment of the current - voltage converter circuit 55 is especially shown. In this embodiment, the output voltage $v_s$ of an operational amplifier 61 becomes $v_s = -i \cdot R_L \cdot R_f / R_S$.

Although not illustrated in the embodiments, the application of a D.C. voltage to the non-inverting input terminal of the operational amplifier 61 is convenient for the adjustment of the circuit, etc. because the level of the whole output voltage $v_s$ of the operational amplifier can be controlled.

Figure 14:
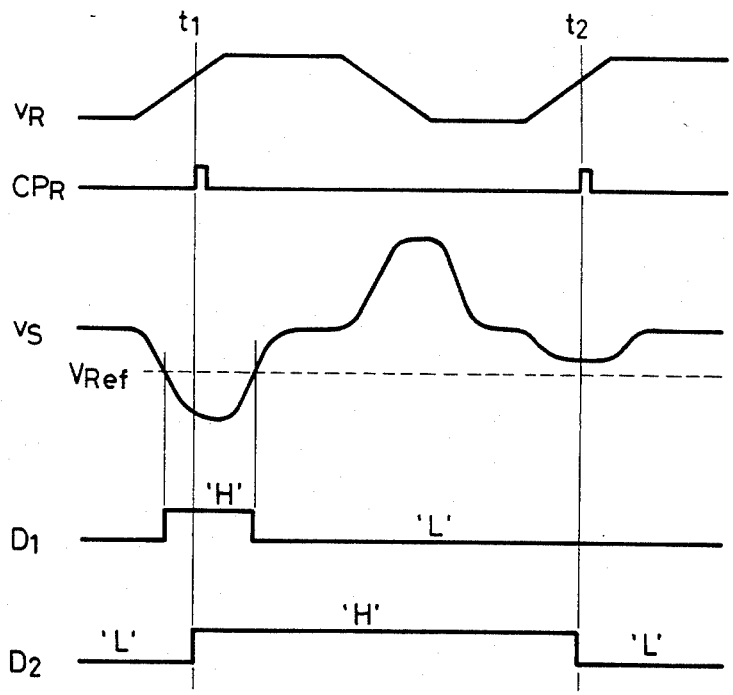

The voltage waveforms of various parts in FIG. 12 or 13 are shown in FIG. 14. Here, the comparator 62 is assumed to provide "H" (high level) when the detection voltage $v_s$ is lower than the reference voltage $V_{Ref}$, and to provide "L" (low level) when the former is higher contrariwise. As illustrated in the figure, the capacitance of the picture element can be detected every clock of the reading voltage $V_R$. This is the most suitable for fast reading.

Figure 15:
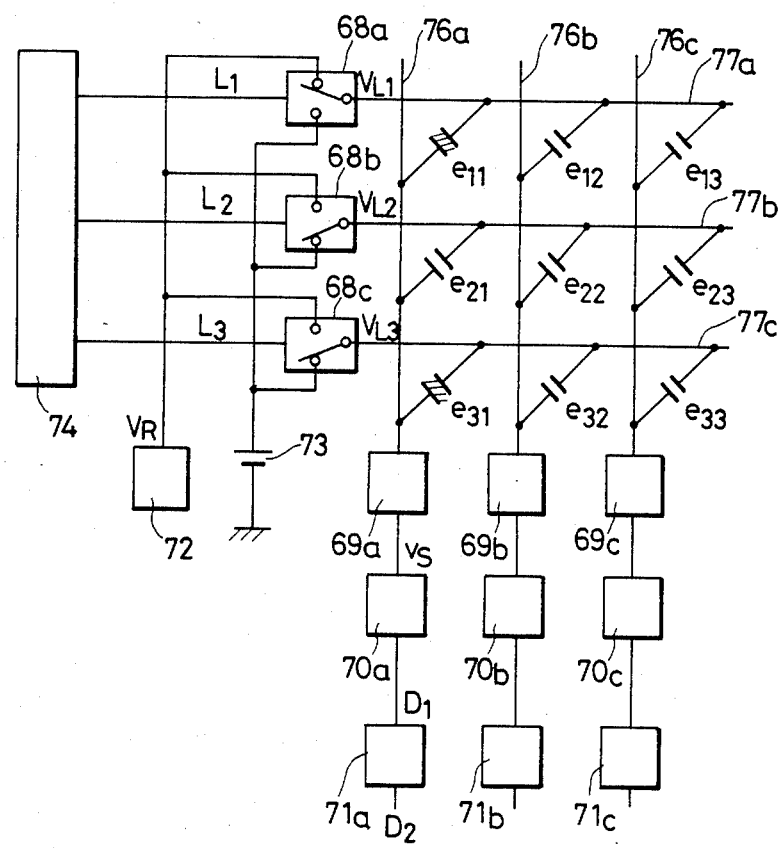

FIG. 15 shows a practicable example of the reading of capacitances.

Switch pairs 68a–68c are connected to Y-electrodes 77a–77c. The switches are supplied with a reading voltage $V_R$ from a reading pulse circuit 72 and a voltage from a constant voltage source 73. The change-over of the switches is effected by a scanning circuit 74.

On the other hand, current - voltage converter circuits 69a–69c are connected to X-electrodes 76a–76c. Further, waveshaping circuits 70a–70c are connected to the current - voltage converter circuits 69a–69c. Besides, picture information signal converter circuits 71a–71c are connected to the waveshaping circuits 70a–70c.

In operation, when only the switch pair 68a has selected the reading voltage $V_R$, the output voltages of the picture signal converter circuits 71a–71c become the "H" level or "L" level in correspondence with the capacitances of picture elements $e_{11}$, $e_{12}$ and $e_{13}$ on the basis of the same principle as in the operation described with reference to FIG. 10. Thereafter, similar operations are performed for the switch pairs 68b and 68c.

Figure 16:
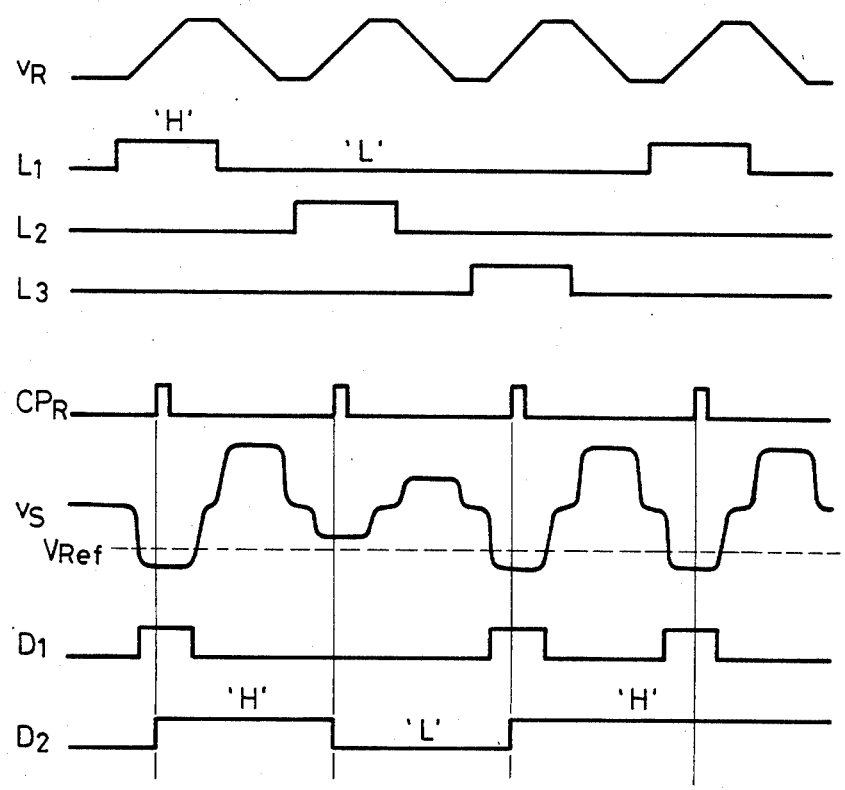

Now, assuming that the reading voltage $V_R$ be selected when the control signals $L_1$–$L_3$ of the switch pairs 68a–68c are at the "H" level, while the constant voltage source 73 be selected when they are at the "L" level, and that picture elements $e_{11}$ and $e_{31}$ be in the write state, the voltage waveforms of various parts become as shown in FIG. 16. $V_S$, $D_1$ and $D_2$ indicate waveforms obtained by reading out the capacitances of picture elements $e_{11}$, $e_{21}$ and $e_{31}$. They can be successively read out in such a manner that each is provided in one clock of the reading voltage $V_R$.

EMBODIMENT 6

Figure 17:
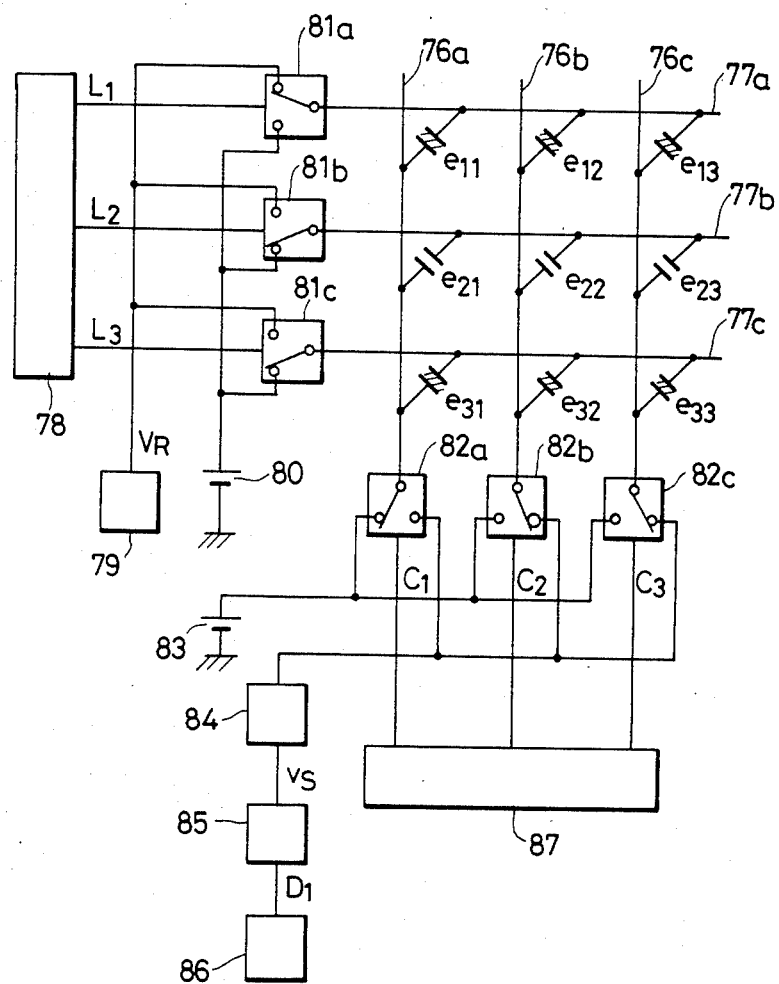

FIG. 17 shows another embodiment. Switch pairs 81a–81c are connected to Y-electrodes 77a–77c. The switch pairs 81a–81c are supplied with a reading voltage $V_R$ from a reading pulse circuit 79 and a voltage from a constant voltage source 80. The change-over of the switches is effected by a scanning circuit 78.

On the other hand, switch pairs 82a–82c are connected to X-electrodes 76a–76c. A constant voltage source 83 is connected to one input terminal of each of the switch pairs 82a–82c, and a current-voltage voltage converter circuit 84 to the other input terminal. Following the circuit 84, a waveshaping circuit 85 and a picture information signal converter circuit 86 are connected. The change-over of the switch pairs 82a–82c is effected by a scanning circuit 87.

Figure 18:
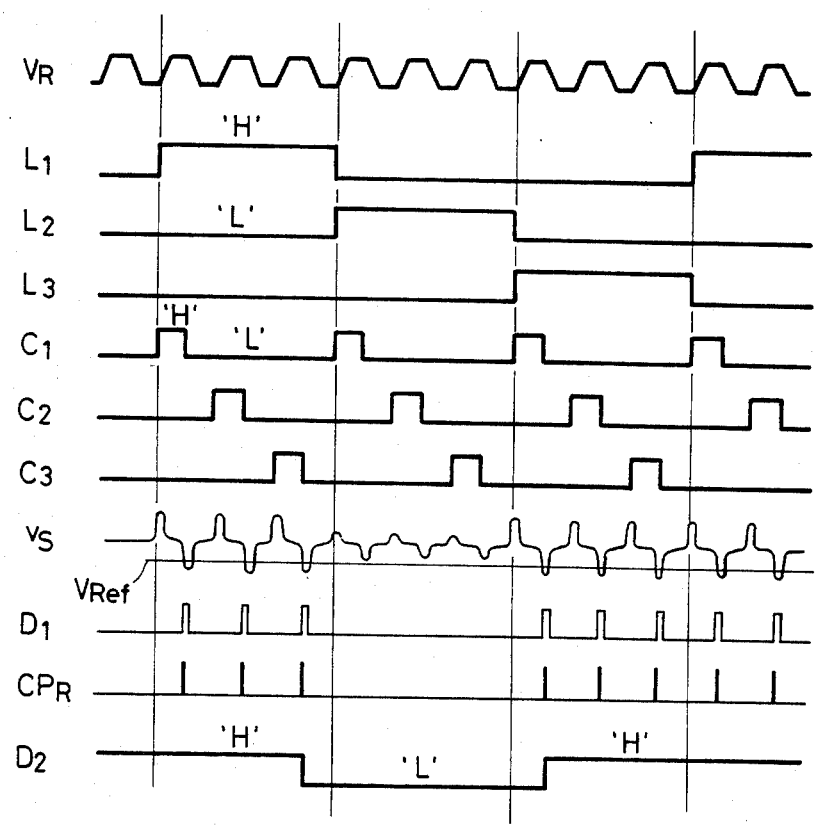

FIG. 18 shows the voltage waveforms of various parts in FIG. 17 under the assumption that picture elements $e_{21}$, $e_{22}$ and $e_{23}$ be in the non-write state.

The switch pairs 81a–81c are assumed to select the reading voltage $V_R$ when the control signals $L_1$–$L_3$ are at the "H" level, and to select the constant voltage source 80 when they are at the "L" level.

On the other hand, the switch pairs 82a–82c are assumed to select the current - voltage converter circuit 84 when the control signals $C_1$–$C_3$ are at the "H" level, and to select the constant voltage source 83 when they are at the "L" level.

As understood from FIGS. 17 and 18, the picture elements $e_{11}$ to $e_{33}$ have their information read out successively one by one in the present embodiment.

The feature of the embodiment shown in FIGS. 17 and 18 is that the numbers of the current - voltage converter circuit, waveshaping circuit and picture information signal converter circuit can be minimized. This facilitates the adjustments of the circuits.

EMBODIMENT 7

Figure 19:
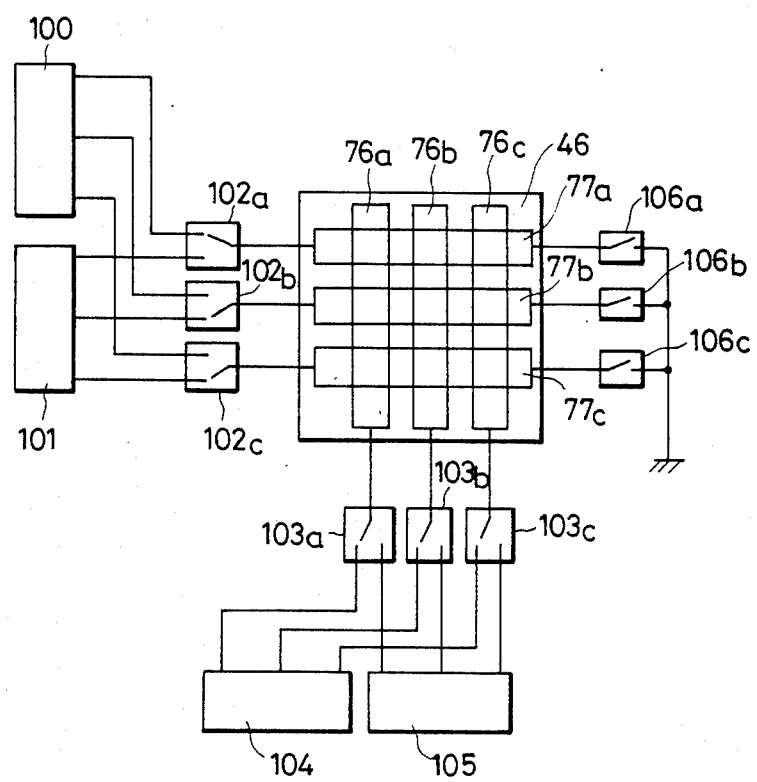
FIG. 19 is a diagram showing an embodiment in which the writing and reading of information are unitarily combined.

FIG. 19 shows an embodiment in which the information writing and reading circuits thus far described are made unitary.

Selector switches 103a–103c are connected to the X-electrodes 76a–76c. An X-electrode driving circuit 104 is connected to one input terminal of each of the selector switches, while a displacement current detector circuit 105 is connected to to the other input terminal.

Selector switches 102a–102c are connected to the ends of the Y-electrodes 77a–77c on one side. A Y-electrode driving circuit 100 is connected to one input terminal of each of the selector switches, while a capacitance reading voltage-generator circuit 101 is connected to the other input terminal.

Further, switches 106a–106c are connected to the ends of the Y-electrodes 77a–77c on the other side.

Here, when information is to be written, the selector switches 102a–102c select the Y-electrode driving circuit 100, while the selector switches 103a–103c select the X-electrode driving circuit 104.

In the present embodiment, the writing with a laser beam can be jointly employed. All the switches 106a–106c are brought into the "off" state for the writing with the laser beam shown in FIGS. 6 or 7, and all the switches are brought into the "on" state for the writing based on the heat generation of electrodes shown in FIG. 8.

On the other hand, when information is to be read out, the selector switches 102a–102c and 103a–103c select the capacitance reading voltage-generator circuit 101 and the displacement current detector circuit 105, respectively. At this time, the switches 106a–106c are brought into the "off" state.

According to the present embodiment, it becomes possible that any desired picture is written into and displayed on a liquid crystal panel from an external circuit on the basis of the heat generation of electrodes, that an observer or user supplements, revises or deletes information with a laser pen at will, and that the information is read out to be delivered to an external circuit.

As set forth above, in the embodiments of the present invention, a voltage varying with time is applied to a liquid crystal having a smectic phase, and a displacement current flowing through the liquid crystal is principally detected. Therefore, a capacitance can be detected by at least one time of voltage application, and it becomes possible to read out information in a short time.

Further, in the embodiments of the present invention, even when, in a case where picture elements are arranged in the shape of an X-Y matrix, currents are flowing through the picture elements other than the picture element to have its capacitance measured, the capacitance can be detected without the influence of crosstalk, and the inputting/outputting information signals is permitted by the use of a simple circuit.

In the present embodiment, the liquid crystal having the smectic phase has been exemplified and explained. As stated before, however, the present invention is applicable to any dielectric, such as a liquid crystal having a cholesteric pahse or PLZT, whose capacitance is changed by applying an electric field, heat or the like and is stored without change for a fixed time even after the electric field, the heat or the like has been removed.

Means for changing capacitances of the dielectrics may be any means to change capacitances of the dielectrics, such as heating means, electric field applying means, electric current applying means and the like.

When some or all of the electrodes to be formed on the substrates are made of a metal such as Cr or Al, electrode resistances can be lowered, and the rise or fall response time of the displacement current to be detected can be shortened. This is well-suited for fast read-out.

As described above, according to the first feature of the present invention, an information holding device which is made of a dielectric such as smectic liquid crystal is endowed with the function of reading out information in a short time, whereby an information holding device capable of inputting/outputting information can be provided.

Further, according to the second feature of the present invention, in an information holding device wherein picture elements are arranged in the shape of an X-Y matrix, an information holding device capable of inputting/outputting information with a simple circuit without quite no influence of current attributed to crosstalk can be provided.

We claim:

1. An information holding device comprising a pair of substrates having opposing surfaces, one substrate being formed with one electrode and the other substrate being formed with another electrode so that said one and said other electrodes are in opposition, a dielectric which is held between said pair of substrates, means to change a capacitance of the dielectric in the region between said one electrode and said other electrode where said one and other electrodes are in opposition, means to apply a voltage varying with time to the dielectric in said region of opposition, and means to detect principally a displacement current flowing through the dielectric in said region of opposition.

2. An information holding device comprising a pair of substrates having opposing surfaces, one substrate being formed with a plurality of electrodes and the other substrate being formed with a plurality of electrodes so that the plurality of electrodes on the respective substrates are in opposition and opposing parts between the opposing electrodes form a matrix as a whole, a dielectric which is held between said pair of substrates, means to change a capacitance of the dielectric in any desired one of the opposing parts, means to selectively apply a voltage varying with time to any desired one of said electrodes on said one substrate, and means to detect principally a displacement current flowing to the electrode on said other substrate.

3. An information holding device according to claim 1, wherein said dielectric is a dielectric whose capacitance is changed when an electric field or heat or the like is applied thereto and is stored without changing for a fixed time even after the electric field or heat or the like is removed therefrom.

4. An information holding device according to claim 3, wherein said dielectric is a liquid crystal which has a smectic phase.

5. An information holding device according to claim 1 wherein said means to change the capacitance of said dielectric is means to heat said dielectric.

6. An information holding device according to claim 1 wherein the voltage varying with time is a voltage whose dV/dt is constant.

7. An information holding device according to claim 1 wherein the voltage varying with time is a voltage of such an extent of magnitude that the capacitance of said dielectric is substantially unchanged.

8. An information holding device according to claim 2, wherein said dielectric is a dielectric whose capacitance is changed when an electric field or heat is applied thereto and is stored without changing for a fixed time even after the electric field or heat is removed therefrom.

9. An information holding device according to claim 8, wherein said dielectric is a liquid crystal which has a smectic phase.

10. An information holding device according to claim 2, wherein said means to change the capacitance of said dielectric is a means for heating said dielectric.

11. An information holding device according to claim 2, wherein the voltage varying with time is a voltage whose dV/dt is constant.

12. An information holding device according to claim 2, wherein the voltage varying with time is a voltage having a magnitude such that the capacitance of said dielectric is substantially unchanged.

13. An information holding device comprising a pair of substrates having opposing surfaces, at least a first electrode disposed on one opposing surface of one substrate and at least a second electrode disposed on the other opposing surface of the other substrate so that the first and second electrodes have at least one part thereof in opposition to each other, a dielectric disposed between the pair of substrates, means for changing a capacitance of the dielectric in the region between the at least one opposing parts of the first and second electrodes, means for applying a voltage varying with time to the dielectric in the region of the at least one opposing parts, and means for detecting principally a displacement current flowing through the dielectric in the region of the at least one opposing parts.

14. An information holding device according to claim 13, wherein a plurality of first and second electrodes are provided, the first and second electrodes being arranged in a matrix so that a plurality of opposing parts of the first and second electrodes are provided, the means for changing a capacitance of the dielectric selectively changing the capacitance in the region of the dielectric between at least a selected one of the opposing parts, the means for applying a voltage varying with time to the dielectric selectively applying the voltage through at least a selected one of the opposing parts of the first electrodes, and the means for detecting principally a displacement of current flowing through the dielectric being provided for detecting the current flowing to the opposing parts of the second electrodes.

15. An information holding device according to claim 14, wherein the dielectric is a dielectric whose capacitance is changed when an electric field or heat is applied thereto and is stored without changing for a fixed time even after the electric field or heat is removed therefrom.

16. An information holding device according to claim 13, wherein the dielectric is a dielectric whose capacitance is changed when an electric field or heat is applied thereto and is stored without changing for a fixed time even after the electric field or heat is removed therefrom.

17. An information holding device according to claim 16, wherein the dielectric is a liquid crystal which has a smectic phase.

18. An information holding device according to claim 13, wherein the means for changing the capacitance of the dielectric comprises means for heating the dielectric.

19. An information holding device according to claim 13, wherein the means for applying a voltage varying with time applies a voltage whose dV/dt is constant.

20. An information holding device according to claim 13, wherein the means for applying a voltage varying with time applies a voltage having a magnitude such that the capacitance of the dielectric is substantially unchanged.

* * * * *